United States Patent [19]

Henriksen et al.

[11] Patent Number: 4,503,477
[45] Date of Patent: Mar. 5, 1985

[54] METHOD AND ARRANGEMENT FOR PROTECTING A THYRISTOR SWITCH OF A PULSE GENERATOR

[75] Inventors: Henrik Henriksen; Torben G. Nielsen; Claus E. Taarning, all of Ballerup, Denmark

[73] Assignee: F. L. Smidth & Company, Cresskill, N.J.

[21] Appl. No.: 380,290

[22] Filed: May 20, 1982

[30] Foreign Application Priority Data

May 21, 1981 [GB] United Kingdom ................ 8115606

[51] Int. Cl.³ .............................................. H02H 7/09
[52] U.S. Cl. ......................................... 361/2; 361/6; 361/91; 361/235
[58] Field of Search ........................ 361/2, 5, 6, 7, 91, 361/110, 111, 112, 235; 363/51, 54, 57; 323/237, 276, 277; 55/105, 139

[56] References Cited

U.S. PATENT DOCUMENTS

| | | | |
|---|---|---|---|
| 3,865,438 | 2/1975 | Boksjo et al. | 321/13 |
| 3,881,147 | 4/1975 | Ueda et al. | 363/57 |
| 3,943,419 | 3/1976 | Thiele | 361/7 |
| 4,052,177 | 10/1977 | Kide | 55/139 |
| 4,238,810 | 12/1980 | Stevenson et al. | 361/91 |
| 4,282,014 | 8/1981 | Winkler et al. | 55/139 |
| 4,313,156 | 1/1982 | Kobayashi et al. | 363/54 |
| 4,325,114 | 4/1982 | Kobayashi et al. | 363/68 |

FOREIGN PATENT DOCUMENTS 2005724 11/1970 Fed. Rep. of Germany.
3015198 10/1980 Fed. Rep. of Germany.

Primary Examiner—Harry E. Moose, Jr.
Attorney, Agent, or Firm—Pennie & Edmonds

[57] ABSTRACT

A method and apparatus for protecting switching elements, and, in particular, thyristor switching elements, which are used in a pulse generator to supply pulsed electrical voltage to a capacitive load, from damage resulting from a spark-over occurring in that load are described. Specifically, whenever the occurrence of a spark-over is detected, during, for example, the interval of time when a voltage pulse applied across the load is decaying, a trigger pulse is applied by a firing circuit to the thyristors to cause them to assume a substantially conductive state.

34 Claims, 8 Drawing Figures

METHOD AND ARRANGEMENT FOR PROTECTING A THYRISTOR SWITCH OF A PULSE GENERATOR

BACKGROUND OF THE INVENTION

1. Field of the Invention

This invention relates to a method and apparatus for protecting an electrical switching element, illustratively, a thyristor, used in a pulse generator which supplies a capacitive load, against damage from spark-overs that may occur in that load.

2. Description of the Prior Art

An inherent problem in using pulsed energy to drive a large capacitive load, e.g. that present in large electrostatic precipitators, is that a considerable amount of energy is required to repetitively charge the load capacitance to a high voltage level. Since the capacitive load dissipates relatively little energy as the result of each applied pulse, recovery of the remaining energy stored in the load, and not consumed by, for example, corona discharge or arcing, is of prime economic importance.

This problem has been solved by using so-called energy conserving pulse generators. Arrangements which perform this function are well-known in the art and are typified by that described in British Pat. No. 1,544,105. There, energy conservation is obtained by connecting a diode in reverse across the thyristor, i.e. the diode's anode is connected to the thyristor's cathode, and vice versa. Specifically in this arrangement, the current flowing through the capacitive load as the result of any drive pulse takes on a sinusoidal waveshape. During one half of the sinusoid, the thyristor conducts; however, it fails to conduct during the second half. To conserve energy, the diode conducts the load current which flows during the second half and while, more particularly, the thyristor assumes a substantially non-conductive state.

The design criteria for the thyristors and diodes in the switch element are:
hold-off voltage
pulse width
peak on-state current
maximum rate of rise of current
thyristor turn-off time.

Spark-overs occur from time to time in certain capacitive loads and in fact often occur in precipitators. Specifically, spark-overs can occur both during the rise of an applied voltage pulse appearing across the precipitator and during the decay of that pulse. If a spark-over occurs during the decay, then the thyristor may be disadvantageously destroyed. Specifically, in the energy conserving pulse system described in British Pat. No. 1,544,105, the load current, as discussed above, flows through the diode while the thyristor is in a substantially non-conductive state. During a part of the time while this current is flowing, the thyristor is recovering its hold-off strength. The hold-off strength is defined as the thyristor's ability to block current flow while withstanding a forward biased voltage applied across its anode and cathode. While the thyristor is recovering, the magnitude of the current flowing through the thyristor continually decreases. Unfortunately, during this time, the thyristor has an unevenly distributed conductivity. Should spark-over occur any time during recovery, then a substantial pulse of current will flow through the thyristor and will, more particularly, be concentrated in those spots having high conductivity. This, in turn, may cause excessive heating at those spots which may disadvantageously destroy the thyristor.

SUMMARY OF THE INVENTION

Accordingly, one object of this invention is to provide a method and arrangement for protecting all the switching elements, e.g. thyristors, in an energy conserving pulse generator, which supplies a capacitive load, from being destroyed as the result of a spark-over.

A particular object of this invention is to provide a method and arrangement of protecting those switching elements from being destroyed due to excessive current density as a result of a spark-over which occurs during the time when the voltage pulse appearing across the capacitive load is decaying.

A more particular object of this invention is to provide a method and arrangement of protecting these switching elements from being destroyed due to excessive current density as a result of a spark-over which occurs during the time when those switching elements are recovering their hold-off strength.

These and other objects are achieved in accordance with the invention by first detecting the occurrence of a spark-over and, in response thereto, causing the thyristor to assume a substantially conductive state.

In accordance with a specific embodiment disclosed herein, a timer is started at the instant a voltage pulse is produced and continues to run throughout the duration of the pulse appearing across the capacitive load. Simultaneously therewith, the slope of the voltage appearing across the load is detected. If the value of the slope exceeds a preset positive value at any time while the timer is running, then a separate trigger circuit applies a trigger pulse to the gate of the thyristor to cause it to conduct.

In accordance with a second embodiment disclosed herein, the capacitive load current is sensed. This current normally consists of a sinusoidally shaped negative half-period followed by a sinusoidally shaped positive half-period. The thyristor switching element is triggered to conduct by the triggering circuit whenever the capacitive load current shifts to a negative value during the normally positive half-period.

In accordance with an aspect of the invention, a trigger pulse only needs to be applied to the thyristor to cause it to conduct in response to a spark-over, when that spark-over occurs during the decay of a voltage pulse appearing across the capacitive load.

BRIEF DESCRIPTION OF THE DRAWING

The invention may be clearly understood from a consideration of the following detailed description and accompanying drawing in which.

To facilitate easy understanding, identical reference characters are used to denote identical elements common to various figures.

DETAILED DESCRIPTION

Figure 1:
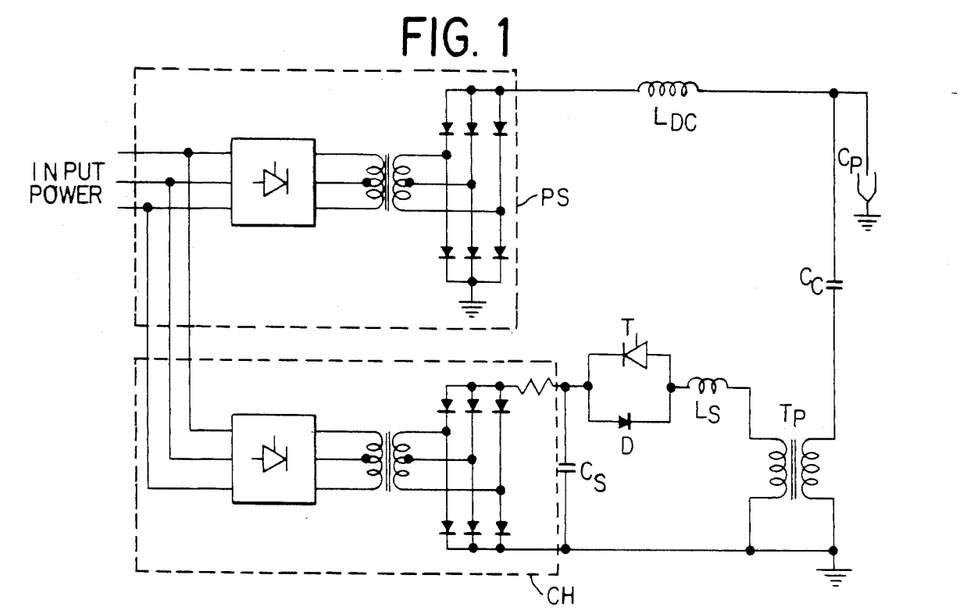
FIGS. 1 and 2 schematically depict electrical circuits for a pulse generator which drives a capacitive load e.g. an electrostatic precipitator with voltage pulses superimposed on a negative DC voltage.
Figure 2:
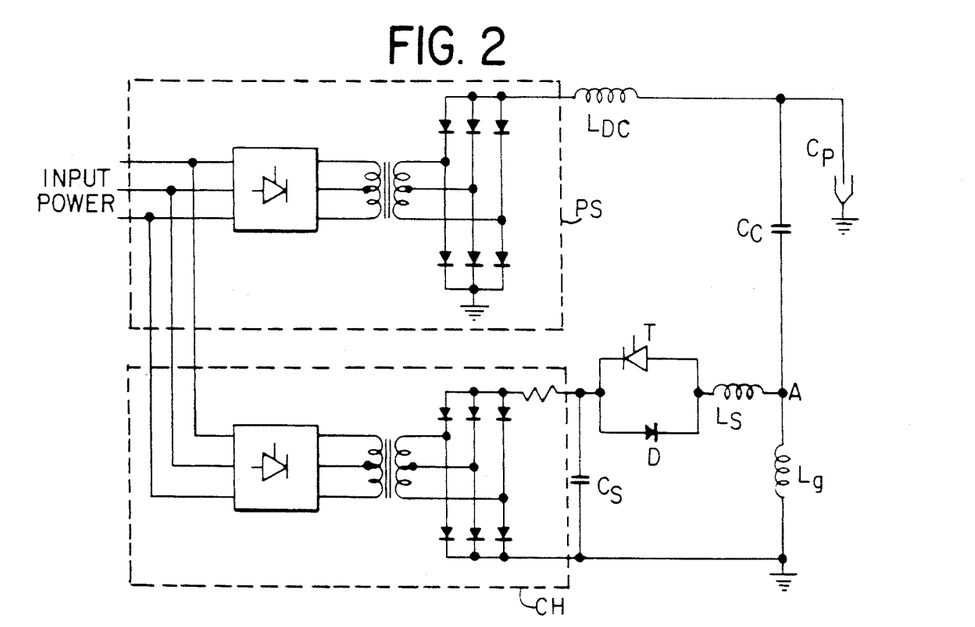

FIGS. 1 and 2 schematically depict pulse generating circuits known to the art which provide voltage pulse energization of electrostatic precipitators. For purposes of simplicity, the electrostatic precipitator is shown as its electrical equivalent, namely precipitatorcapacitor $C_p$. The pulses provided by the generator are superimposed on a negative DC voltage and the pulse generator shown is of the energy conserving type, illustratively described in British Pat. No. 1,544,105.

As shown in FIG. 1, the pulse generator is initially comprised of power supply PS and charger CH. The power supply provides a negative DC voltage for operating the precipitator and the charger is used to provide a source of energy for the voltage pulses that are superimposed on the negative DC voltage and applied across the precipitator. Storage capacitor $C_s$ is connected across the output of the charger, and it stores the energy for each pulse. A switch element, which is shown as thyristor T, is connected in series with the output of the charger and serves to apply the voltage stored in the capacitor to the load circuit, comprised of inductor $L_s$, pulse transformer $T_p$, coupling capacitor $C_c$ and the precipitator. Diode D is connected in reverse across the thyristor. This diode provides a path through which the load current flows while the thyristor is in a substantially non-conductive state. Series inductor $L_s$ is connected to the precipitator through pulse transformer $T_p$. Coupling capacitor $C_c$ is connected in series with the output of the pulse transformer and this capacitor blocks the DC supply voltage from entering the pulse transformer. Blocking inductor $L_{DC}$, which is connected in series with the output of the power supply, prevents the voltage pulses from entering the power supply. With this arrangement, the maximum voltage which the thyristor must be capable of switching—i.e., the amount of forward biased voltage appearing across the thyristor instantaneously before it begins to conduct and henceforth referred to as the maximum thyristor switching voltage—can advantageously be readily set by appropriately selecting the turns ratio of the pulse transformer. For example, the maximum thyristor switching voltage may be selected anywhere between 1/50 and 1/5 of the maximum peak voltage appearing across the precipitator, with the particular value chosen by optimizing various technical and cost tradeoffs inherent in selecting the proper turns ratio.

As depicted in FIG. 2, pulse transformer $T_p$ has been replaced by inductor $L_g$. This inductor serves to keep point A grounded with respect to any DC voltages but isolated from ground with respect to the frequencies comprising the voltage pulses. In this arrangement, the maximum thyristor switching voltage is determined by (a) the maximum peak voltage appearing across the precipitator and (b) the values of capacitance chosen for storage capacitor $C_s$ and coupling capacitor $C_c$. For example, if the values for these two capacitors are approximately equal, then the maximum voltage level that must be switched by the thyristor is approximately equal to half of the maximum peak voltage appearing across the precipitator.

Operationally speaking, the pulse generator circuits shown in FIGS. 1 and 2 function in the same manner, with the only difference between these circuits being the value of the maximum thyristor switching voltage, as described hereinabove. Consequently, for the sake of brevity, only the circuit shown in FIG. 1 will now be described. Specifically, for that circuit, storage capacitor $C_s$ is first charged to a predetermined negative DC level by charger CH. Thereafter, whenever a voltage pulse is to be produced, thyristor T is triggered to conduct by a pulse which is generated by a firing circuit (not shown) and applied to the gate of the thyristor. While the thyristor conducts, the precipitator, here represented by precipitator capacitor $C_p$, charges to the peak pulse voltage by a negative current flowing to storage capacitor $C_s$. By virtue of a series oscillatory circuit comprised of storage capacitor $C_s$, series inductor $L_s$, the leakage inductance of pulse transformer $T_p$ (equal to the value of the inductance of inductor $L_g$ shown in FIG. 2), coupling capacitor $C_c$ and precipitator capacitor $C_p$, the current flowing through the precipitator takes on a sinusoidally shaped waveshape (see FIG. 4), with, more particularly, a negative half-period preceeding a positive half-period. The thyristor conducts current during the negative half-period. During the positive half-period, the thyristor is essentially non-conducting and is, in fact, recovering its hold-off strength. The hold-off strength is defined as the thyristor's ability to block current flow while withstanding a forward-biased voltage applied across its anode and cathode. Also during this half-period, the remaining energy stored in precipitator capacitor $C_p$ returns to storage capacitor $C_s$ as the result of the precipitator current which then flows through diode D. For a circuit without any energy consumption, the peak amplitudes of precipitator current during the two half-periods are equal. Consequently, at the end of the positive half-period, the precipitator voltage is brought back to its negative DC level which occurred prior to the voltage pulse. Also at this time, any current flow in the pulse circuit is completely blocked. The value of the load current remains at zero until the thyristor is triggered again.

The thyristor switching element, in order to advantageously have an increased switching voltage, may be comprised of several individual thyristors all wired in series. In such an arrangement, a diode is connected in reverse across each thyristor. Moreover, to advantageously increase the maximum current that can be switched, a number of thyristor switching elements may be advantageously connected in parallel. For each of these multi-thyristor arrangements, all the thyristors may be turned on by a cable firing system. Specifically, a fast rising, high current pulse is fed through a cable conductor which forms a primary winding of a number of ring-core pulse current transformers. The secondary winding of each of these transformers is connected to the gate of each thyristor. The high current pulse in the cable is supplied by a current generator that is triggered by repetitive trigger signals in accordance with the desired pulse frequency. Thus, while the thyristor switching element shown in FIGS. 1 and 2 is depicted, for the sake of simplicity, as having only one thyristor, it is far more likely that it is comprised of multiple thyristors, all interconnected in an appropriate series-parallel arrangement.

Figure 3:
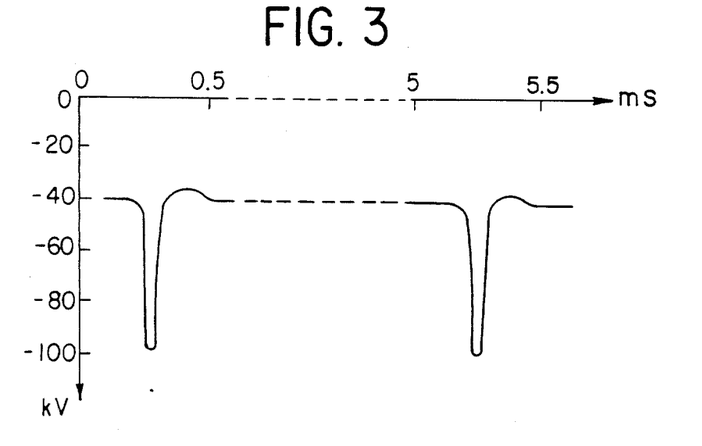
FIG. 3 graphically depicts the voltage produced by the circuit shown in FIGS. 1 or 2 and applied across the capacitive load.
Figure 4:
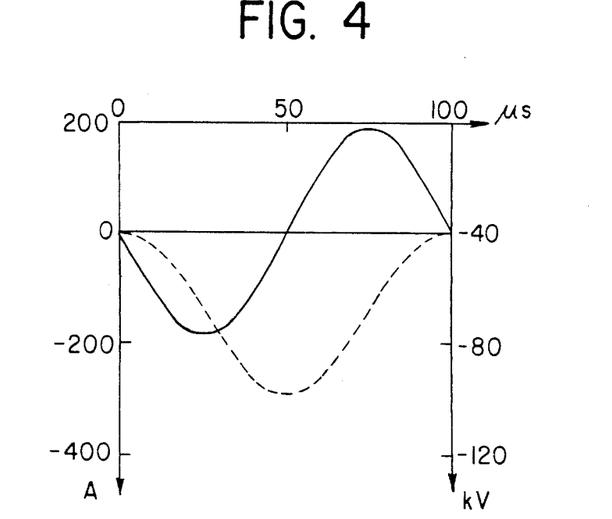
FIG. 4 shows, on an enlarged time scale, a graphic depiction of the load current occurring during a voltage pulse, with the waveform of the voltage pulse shown superimposed on the waveform of the precipitator current.

FIG. 3 graphically shows the general voltage waveform produced by the pulse generators shown in FIGS. 1 or 2 and appearing across the precipitator. As shown, the voltage produced by the pulse generator is comprised of short duration, high voltage, negative polarity pulses repeatedly superimposed on a negative DC voltage. Pulse duration is illustratively 0.5 milliseconds or less, and the time period between adjacent pulses can be set to any value from approximately 50 microseconds, which corresponds to the pulse repetition frequency of 20 kHz, to approximately 40 milliseconds, which corresponds to the pulse repetition frequency of 25 Hz. The waveform of the current flowing through the precipitator is shown in FIG. 4, as a solid line, with the voltage pulse waveform superimposed on it and shown, more particularly, as a dashed line.

In the pulse generator arrangements thus far described, the thyristor switching elements can be destroyed if a spark-over occurs in the capacitive load during the decay of a voltage pulse and, more particularly, while any or all of the thyristors are recovering their hold-off strength. Specifically, the conductivity of the semiconductor pellet which comprises a thyristor usually varies widely throughout the pellet while the thyristor is recovering. Consequently, any current flowing through a thyristor, while it is recovering, is concentrated in those areas of high conductivity. This can, in turn, cause localized heating which could, if excessive, destroy the thyristor.

The present invention therefore is directed to a method and apparatus for protecting the thyristors, in a pulse generator which supplies a capacitive load, from being destroyed whenever a spark-over occurs and, more particularly, when it occurs during the decay of a voltage pulse applied across the load.

Figure 5:
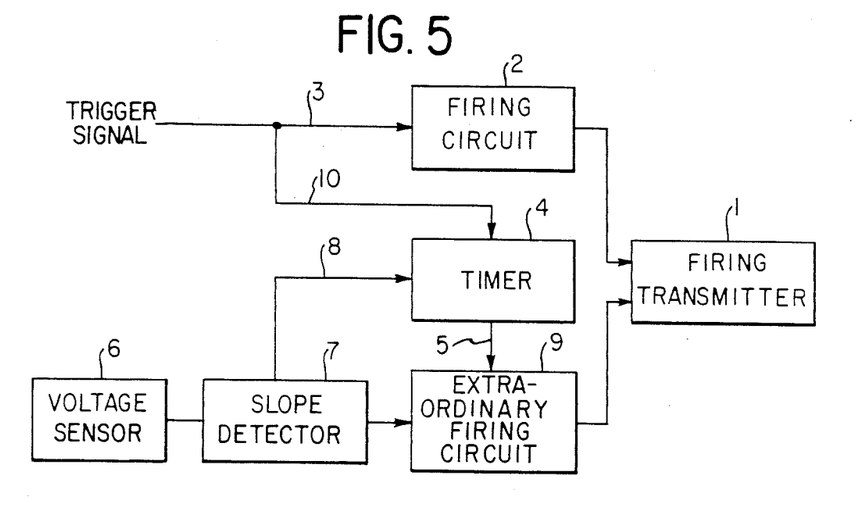
FIG. 5 shows, in block diagram form, a circuit which incorporates the teachings of the present invention for firing the thyristor, shown in FIGS. 1 or 2, during a spark-over.

FIG. 5 depicts a circuit, shown in block diagram form, for firing the thyristors in, for example, the circuitry shown in FIGS. 1 and 2, in accordance with the teachings of the present invention. Specifically, thyristor firing transmitter 1 may be a cable firing system such as the one described hereinabove or another device which simultaneously fires all the thyristors comprising a thyristor switching element. Firing transmitter 1 is energized by firing circuit 2 whenever that circuit receives a trigger signal on its input line 3. Each pulse appearing in the trigger signal causes all the thyristors to fire, which, in turn, applies a voltage pulse across the capacitive load. This trigger signal is illustratively generated by a trigger signal generator (not shown) and has a repetition frequency determined by the desired frequency of the voltage pulses appearing across the capacitive load, i.e. the precipitator shown in FIGS. 1 or 2. The trigger signal is also fed to timer 4 via line 10. Each trigger signal causes the timer to start running. The timer continues to run for the duration of the entire voltage pulse then being applied across the load. Simultaneously therewith, the timer applies a signal, e.g. a high level, on its output line 5 to indicate that a voltage pulse is occurring.

The voltage appearing across the precipitator is sensed by voltage sensor 6. Its output is, in turn, applied to slope detector 7 which detects changes in the amplitude of the sensed precipitator voltage. Slope detector 7, in principal, differentiates the signal produced by voltage sensor 6. If the thyristor is triggered to conduct, then the sensed voltage increases negatively, as the result of the voltage pulse appearing across the precipitator. As soon as a value of the slope exceeds a predetermined negative threshold, the slope detector applies a signal, via lead 8, which, as a safety measure, also causes the timer to both begin timing and simultaneously apply a high level signal to lead 5. This ensures that the timer is started even in the event that the thyristor has been unintentionally triggered, i.e. by means other than a trigger signal applied to input lead 3.

Alternatively, if the slope detector detects a positive slope exceeding a preselected positive threshold, for example, ten times the maximum or peak value expected during a normal pulse decay, then this signifies that a spark-over is occurring. At the instant a spark-over is detected, slope detector 7 applies a signal to extraordinary firing circuit 9. In response thereto, this circuit, if it detects a high level produced by the timer, applies a signal to firing transmitter 1 to fire the thyristors and thereby cause them to assume a conductive state. Advantageously, this firing should take place in a sufficiently short period of time following the spark-over. Experience has shown that the time interval between a spark-over and a firing should advantageously not exceed 5 microseconds (uS) and preferably be kept below 2 microseconds (uS). To keep the circuitry simple, the circuit shown in FIG. 5 does not differentiate between a spark-over occurring during either the rise or decay of a voltage pulse and thus triggers the thyristors to conduct regardless of when, during the voltage pulse, the spark-over occurs.

The firing of the thyristors during a spark-over is, as described above and shown in FIG. 5, accomplished by extraordinary firing circuit 9. The firing could of course be accomplished by using the normal firing circuit 2; however, it is advantageous to use a separate firing circuit which is maintained in a stand-by condition just for this purpose. Specifically, this arrangement ensures that a fully charged firing circuit will always be available for the extraordinary firing.

Figure 6:
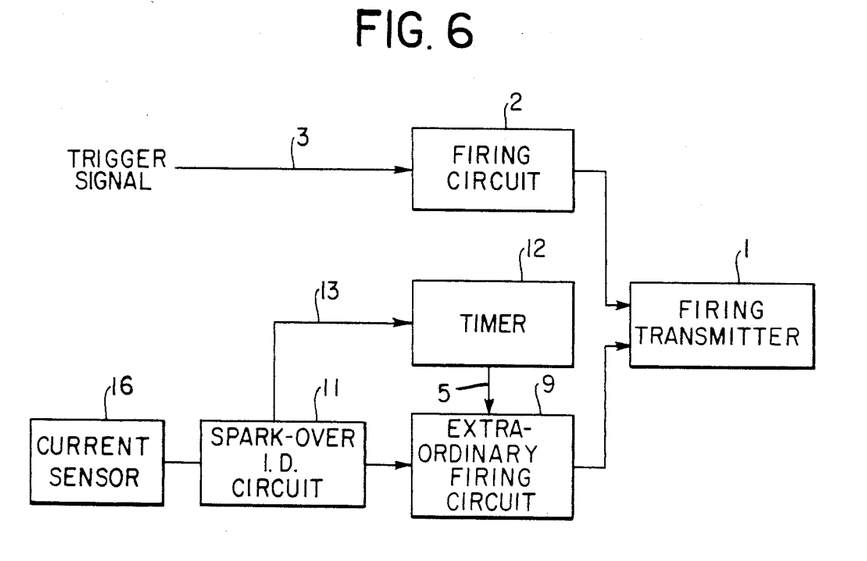
FIG. 6 shows another circuit which incorporates teachings of the present invention for firing the thyristors, shown in FIGS. 1 or 2, during a spark-over.
Figure 7:
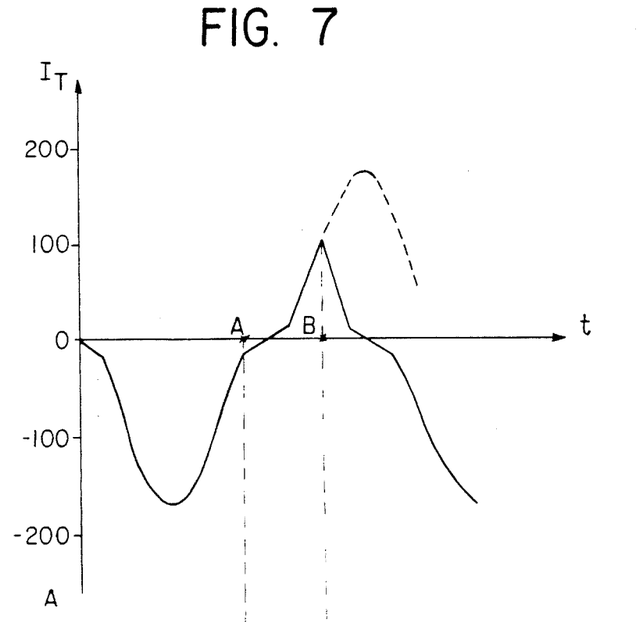
FIG. 7 graphically shows the load current and, more particularly, shows the change in the current caused by a spark-over occurring while a voltage pulse appearing across the load is decaying.

Another circuit which can be advantageously used to fire the thyristors during a spark-over is shown in block diagram form in FIG. 6. This circuit, by contrast with that shown in FIG. 5, triggers the thyristors to conduct as a result of a spark-over only if it occurs during the decay of the voltage pulse. As shown therein, the occurrence of a voltage pulse appearing across the capacitive load is detected by monitoring the load current using current sensor 16. Illustratively, a saturable reactor which is inserted in series with the load, i.e., the precipitator, may be used for the current sensor. Besides acting as a current sensor, this reactor advantageously limits the maximum change per unit time, i.e., $dI/dt$, of the load current. An auxiliary winding on the saturable reactor provides a voltage signal having an amplitude which varies in response to the load current but is advantageously isolated from it. The signal from this auxiliary winding is applied to a spark-over identification circuit 11. During normal operation, i.e., without spark-over, the waveform of the current in the load is comprised of a sinusoidally shaped negative half-period followed by a sinusoidally shaped positive half-period, as indicated in FIG. 4. This waveshape is also depicted by the negative half-period followed by the dashed-line extension shown in FIG. 7. If, however, a spark-over occurs during the decay portion of the voltage pulse occurring across the load, illustratively at point B, then, as shown by the solid line waveform in FIG. 7, the current, $I_T$, through the thyristor during the positive half-period abruptly changes its direction from positive to negative.

Figure 8:
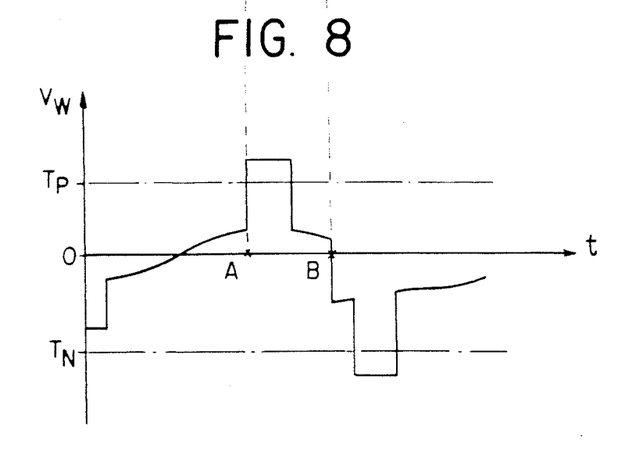
FIG. 8 shows the voltage, produced—as the result of the current shown in FIG. 7—in an auxiliary winding of a saturation reactor placed in series with the capacitive load.

The waveform of voltage $V_w$ which corresponds to the load current and appears across the auxiliary winding is shown in FIG. 8. Shortly before the positive half-period of load current is about to occur, at, for example, point A, the voltage from the auxiliary winding exceeds a preselected positive level $T_p$. In response thereto, the spark-over identification circuit (shown in FIG. 6) applies a signal to lead 13 which, in turn, causes timer circuit 12 to begin timing. This timer continues to run for the remaining duration of the voltage pulse. While the timer is running, it applies a signal on output lead 14 to indicate the occurrence of a positive half-period of load current. If a spark-over occurs in the load, e.g. at point B shown in FIGS. 7 and 8, the load current, as discussed, begins to abruptly change direction from positive to negative. Consequently, the voltage from the auxiliary winding will eventually exceed a predetermined negative level $T_N$, as shown in FIG. 8. As soon as this negative level is exceeded, spark-over identification circuit 11 (shown in FIG. 6) applies a signal to extraordinary firing circuit 9. As long as a high level signal appears on output line 14 from timer 12, (thereby indicating that the normal load current should have been in a positive direction), the extraordinary firing circuit 9 signals firing transmitter 1 to trigger the thyristors to assume a substantially conductive state.

Of course, it can be readily appreciated by those skilled in the art that the teachings of the present invention are not limited to the protection of only thyristors, but rather can be advantageously extended to protect any type of semiconductor switching device, e.g. a transistor, which is used to drive a load which may experience spark-over. By merely incorporating the necessary load voltage and/or load current sensors and the supporting circuitry into the firing circuitry, as exemplified by that described above, the firing circuitry can readily protect the switching device, in accordance with the invention, by causing it to conduct during a spark-over.

In addition, the invention is not only applicable to energy conserving pulse generators of the type described above but can in fact be advantageously used in any pulse generator which feeds a capacitive load that may experience spark-over.

Thus, many and varied arrangements incorporating the teachings of the present invention may be devised by those skilled in the art without departing from the spirit and scope of the invention.

What is claimed is:

1. A method for protecting a semiconductor switching element of an energy conserving pulse generator, which supplies high voltage pulses to a capacitive load, against damage from a spark-over in the load comprising the steps of:
   (a) determining when a pulse is supplied to said load;
   (b) detecting the occurrence of a spark-over; and
   (c) triggering the semiconductor switching element to assume a substantially conductive state when a spark-over is detected during the supply of a pulse.

2. The method in claim 1 in which said detecting step further includes the steps of:
   monitoring the voltage appearing across said load, and
   ascertaining the slope of said monitored voltage.

3. A method for protecting a switching element, which supplies pulsed voltage to a load, against damage from a spark-over in the load, comprising the steps of:
   (a) detecting the occurrence of a spark-over, said detecting step comprising the steps of:
      (i) monitoring current flowing through said load, wherein the wave shape of the current is comprised of a half-period having the current flowing in one direction while a corresponding voltage pulse is rising and another half-period having the current flowing in the opposite direction while the said corresponding voltage pulse is decaying, and
      (ii) ascertaining those instances when the direction of current flow through the load abruptly changes direction during the decay of said corresponding voltage pulse; and
   (b) triggering the switching element to assume a substantially conductive state when a spark-over is detected during the supply of a pulse.

4. The method in claim 3 in which said ascertaining step further includes the steps of:
   determining a period of time during which said corresponding one of said voltage pulses is decaying, and
   producing said firing signal during said time period whenever the direction of said monitored load current abruptly changes direction.

5. The method of claims 2 or 4 in which said triggering step includes the step of generating said firing signal only when said switching element is in a substantially non-conductive state.

6. The method in claim 1 in which said triggering step includes the step of applying said firing signal to said switching element to cause said switching element to assume said conductive state only while any of the supplied voltage pulses is decaying.

7. In a system for supplying voltage pulses to a capacitive load wherein voltage pulses are applied to the load through at least one thyristor switching element having at least one thyristor, a method for protecting the switching element against damage from a spark-over occurring in the load comprising the steps of:
   (a) determining when a pulse is supplied;
   (b) detecting the occurrence of a spark-over; and
   (c) triggering the switching element to assume a substantially conductive state when a spark-over is detected during the supply of the pulse.

8. The method in claim 7 in which said detecting step further includes the steps of:
   monitoring the voltage appearing across said load, and
   ascertaining the slope of said monitored voltage.

9. In a system for supplying voltage pulses to a capacitive load wherein voltage pulses are applied to the load through at least one thyristor switching element having at least one thyristor, a method for protecting the switching element against damage from a spark-over occurring in the load comprising the steps of:

(a) detecting the occurrence of a spark-over, said detecting step comprising the steps of:
  (i) monitoring current flowing through said load, wherein the wave shape of the current is comprised of a half-period having the current flowing in one direction while a corresponding voltage pulse is rising and another half-period having the current flowing in the opposite direction while the said corresponding voltage pulse is decaying, and
  (ii) ascertaining those instances when the direction of current flow through the load abruptly changes direction during the decay of said corresponding voltage pulse; and
(b) triggering the switching element to assume a substantially conductive state when a spark-over is detected during the supply of a pulse.

10. The method in claim 9 in which said ascertaining step further includes the steps of:
  determining a period of time during which said corresponding one of said voltage pulses is decaying, and
  producing said firing signal during said time period whenever the direction of said monitored load current abruptly changes direction.

11. The method in claims 8 or 10 in which said triggering step includes the step of generating said firing signal only when said switching element is in a substantially non-conductive state.

12. The method in claim 9 in which said triggering step includes the step of applying said firing signal to said switching element to cause said switching element to assume said conductive state only while any of the supplied voltage pulses is decaying.

13. In a system for an electrostatic precipitator which includes a pulse generator having at least one thyristor which provides voltage pulses that are applied to said precipitator, a method for protecting said thyristor against damage from a spark-over occurring in the precipitator comprising the steps of:
  (a) determining when a pulse is applied to the precipitator;
  (b) detecting the occurrence of a spark-over; and
  (c) triggering the thyristor to assume a substantially conductive state when a spark-over is detected during the supply of a pulse to the precipitator.

14. The method in claim 13 in which said detecting step further includes the steps of:
  monitoring the voltage appearing across said precipitator, and
  ascertaining the slope of said monitored voltage.

15. The method in claim 3 in which said triggering step includes the step of applying said firing signal to said thyristor to cause said thyristor to assume said conductive state only while any of the applied voltage pulses is decaying.

16. In a system for an electrostatic precipitator which includes a pulse generator having at least one thyristor which provides voltage pulses that are applied to said precipitator, a method for protecting said thyristor against damage from a spark-over occurring in the precipitator comprising the steps of:
  (a) detecting the occurrence of a spark-over, said detecting step comprising the steps of:
    (i) monitoring current flowing through said precipitator, wherein the waveshape of the current is comprised of a half-period having the current flowing in one direction while a corresponding voltage pulse is decaying, and
    (ii) ascertaining those instances when the direction of current flow through the precipitator abruptly changes direction during the decay of said corresponding voltage pulse; and
  (b) triggering the thyristor to assume a substantially conductive state when a spark-over is detected during the supply of a pulse to the precipitator.

17. The method in claim 16 in which said ascertaining step further includes the steps of:
  determining a period of time during which said corresponding one of said voltage pulses is decaying, and
  producing said firing signal during said time period whenever the direction of said monitored precipitator current abruptly changes direction.

18. An arrangement for protecting a semiconductor switching element, which supplies pulsed voltage to a load, against damage from a spark-over occurring in the load, comprising:
  (a) means for determining when a pulse is supplied to said load,
  (b) means for detecting the occurrence of the spark-over; and
  (c) means for triggering the semiconductor switching element to assume a substantially conductive state when a spart-over is detected during the supply of a pulse.

19. The arrangement in claim 18 in which said determining means includes:
  means for monitoring the voltage appearing across said load, and
  means for ascertaining the slope of said monitored voltage.

20. The arrangement in claim 18 in which said triggering means includes means for applying said firing signal to said switching element to cause said switching element to assume said conductive state only while any of the supplied voltage pulses is decaying.

21. An arrangement for protecting a semiconductor switching element, which supplies pulsed voltage to a load, against damage from a spark-over occurring in the load, comprising:
  (a) means for detecting the occurrence of a spark-over, said detecting means comprising:
    (i) means for monitoring current flowing through said load, wherein the wave shape of the current is comprised of a half-period having the current flowing in one direction while a corresponding voltage pulse is rising and another half-period having the current flowing in the opposite direction while said corresponding voltage pulse is decaying, and
    (ii) means for ascertaining those instances when the direction of current flow through the load abruptly changes during the decay of said corresponding voltage pulse; and
  (b) means for triggering the switching element to assume a substantially conductive state when a spark-over is detected during the supply of a pulse.

22. The arrangement in claim 2 in which said ascertaining means includes:
  means for determining a period of time during which said corresponding one of said voltge pulses is decaying, and means for producing said firing signal during said time period whenever the direction of said monitored load current abruptly changes direction.

23. The arrangement in claims 18 or 22 in which said triggering means includes means for generating a firing signal only when said switching element is in a substantially non-conductive state.

24. In a system for applying voltage pulses to a capacitive load wherein the voltage pulses are applied to the load through at least one thyristor, an arrangement for protecting the switching element against damage from a spark-over occurring in the load comprising:
   (a) means for determining when a pulse is supplied to said load;
   (b) means for detecting the occurrence of a spark-over; and
   (c) means for triggering the switching element to assume a substantially conductive state when a spark-over is detected during the supply of a pulse.

25. The arrangement in claim 24 in which said detecting means includes:
   means for monitoring the voltage appearing across said load, and
   means for ascertaining the slope of said monitored voltage.

26. The arrangement in claim 24 in which said triggering means includes means for applying said firing signal to said switching element to cause said switching element to assume said conductive state only while any of the applied voltage pulses is decaying.

27. In a system for applying voltage pulses to a capacitive load wherein the voltage pulses are applied to the load through at least one thyristor, an arrangement for protecting the switching element against damage from a spark-over occurring in the load comprising:
   (a) means for detecting the occurrence of the spark-over, said detecting means comprising:
      (i) means for monitoring current flowing through said load, wherein the waveshape of the current is comprised of a half-period having the current flowing in one direction while a corresponding voltage pulse is rising and another half-period having the current flowing in the opposite direction while said corresponding voltage pulse is decaying, and
      (ii) means for ascertaining those instances when the direction of current flow through the load abruptly changes direction during the decay of the voltage pulse; and
   (b) means for triggering the switching element to assume a substantially conductive state when a spark-over is detected during the supply of a pulse.

28. The arrangement in claim 23 in which said ascertaining means includes:
   means for determining a period of time during which said corresponding one of said voltage pulses is decaying, and
   means for producing said firing signal during said time period whenever the direction of said monitored load current abruptly changes direction.

29. The arrangement in claims 24 or 28 in which said triggering means includes means for generating a firing signal only when said switching element is in a substantially nonconductive state.

30. In a system for an electrostatic precipitator which includes a pulse generator having at least one thyristor which provides voltage pulses that are applied to said precipitator, an arrangement for protecting said thyristor against damage from a spark-over occurring in the precipitator comprising:
   (a) means for determining when a pulse is supplied to said precipitator;
   (b) means for detecting the occurrence of the spark-over; and
   (c) means for triggering the thyristor to assume a substantially conductive state when a spark-over is detected during the supply of a pulse.

31. The arrangement in claim 30 in which said detecting means includes:
   means for monitoring the voltage appearing across said precipitator, and
   means for ascertaining the slope of said monitored voltage.

32. The arrangement in claim 30 in which said triggering means includes means for applying said firing signal to said thyristor to cause said thyristor to assume said conductive state only while any of the applied voltage pulses is decaying.

33. In a system for an electrostatic precipitator which has a pulse generator having at least one thyristor which provides voltage pulses that are applied to said precipitator, an arrangement for protecting said thyristor against damage from a spark-over occurring in the precipitator comprising:
   (a) means for detecting the occurrence of the spark-over, said detecting means comprising:
      (i) means for monitoring current flowing through said precipitator, wherein the waveshape of the current is comprised of a half-period having the current flowing in one direction while a corresponding voltage pulse is rising and another half-period having the current flowing in the opposite direction while said corresponding voltage pulse is decaying, and
      (ii) means for ascertaining those instances when the direction of current flow through the precipitator abruptly changes direction during the decay of said corresponding voltage pulse; and
   (b) means for triggering the thyristor to assume a substantially conductive state when a spark-over is detected during the supply of a pulse.

34. The arrangement in claim 33 in which said ascertaining means includes:
   means for determining a period of time during which said corresponding one of said voltage pulses is decaying, and
   means for producing said firing signal during said time period whenever the direction of said monitored precipitator current abruptly changes direction.

* * * * *